(12) United States Patent
Ahn et al.

(10) Patent No.: US 8,530,330 B2
(45) Date of Patent: Sep. 10, 2013

(54) METHOD FOR MANUFACTURING A SEMICONDUCTOR DEVICE CAPABLE OF PREVENTING THE DECREASE OF THE WIDTH OF AN ACTIVE REGION

(75) Inventors: Sang Tae Ahn, Gyeonggi-do (KR); Ja Chun Ku, Gyeonggi-do (KR); Eun Jeong Kim, Jeollanam-do (KR); Wan Soo Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 297 days.

(21) Appl. No.: 12/100,455

(22) Filed: Apr. 10, 2008

(65) Prior Publication Data

US 2009/0162990 A1    Jun. 25, 2009

(30) Foreign Application Priority Data

Dec. 21, 2007   (KR) .................. 10-2007-0135599

(51) Int. Cl.
*H01L 21/76* (2006.01)
(52) U.S. Cl.
USPC ............ 438/435; 438/424; 438/243; 438/244
(58) Field of Classification Search
USPC ......... 438/221–224, 296, 359–361, 424–438, 438/257; 257/E21.546–E21.55
See application file for complete search history.

(56) References Cited

U.S. PATENT DOCUMENTS

| | | | |
|---|---|---|---|
| 5,719,416 A * | 2/1998 | Yoshimori et al. | 257/295 |
| 6,255,194 B1 * | 7/2001 | Hong | 438/435 |
| 6,544,842 B1 * | 4/2003 | Chen et al. | 438/255 |
| 6,642,596 B2 * | 11/2003 | Hong | 257/429 |
| 6,723,617 B1 * | 4/2004 | Choi | 438/424 |
| 6,939,780 B2 * | 9/2005 | Yun et al. | 438/437 |
| 7,459,364 B2 * | 12/2008 | Lee et al. | 438/424 |
| 7,462,544 B2 * | 12/2008 | Kim et al. | 438/294 |
| 7,528,052 B2 * | 5/2009 | Lim et al. | 438/435 |
| 2001/0051408 A1 * | 12/2001 | Chiu | 438/243 |
| 2006/0001107 A1 | 1/2006 | Kim et al. | |
| 2007/0004170 A1 * | 1/2007 | Kawasaki et al. | 438/452 |
| 2007/0037360 A1 * | 2/2007 | Jeong | 438/424 |
| 2008/0090378 A1 * | 4/2008 | Tsunoda et al. | 438/425 |
| 2008/0160716 A1 * | 7/2008 | Seo et al. | 438/425 |

FOREIGN PATENT DOCUMENTS

| | | | |
|---|---|---|---|
| KR | 1020030003542 A | | 1/2003 |
| KR | 1020050012872 | * | 8/2006 |
| KR | 1020060091621 | * | 8/2006 |
| KR | 1020060091621 A | | 8/2006 |
| KR | 1020070016368 A | | 2/2007 |

* cited by examiner

*Primary Examiner* — David Vu
*Assistant Examiner* — Jonathan Han
(74) *Attorney, Agent, or Firm* — Ladas & Parry LLP

(57) ABSTRACT

A method for manufacturing a semiconductor device that can prevent the loss of an isolation structure and that can also stably form epi-silicon layers is described. The method for manufacturing a semiconductor device includes defining trenches in a semiconductor substrate having active regions and isolation regions. The trenches are partially filled with a first insulation layer. An etch protection layer is formed on the surfaces of the trenches that are filled with the first insulation layer. A second insulation layer is filled in the trenches formed with the etch protection layer to form an isolation structure in the isolation regions of the semiconductor substrate. Finally, portions of the active regions of the semiconductor substrate are recessed such that the isolation structure has a height higher than the active regions of the semiconductor substrate.

20 Claims, 8 Drawing Sheets

METHOD FOR MANUFACTURING A SEMICONDUCTOR DEVICE CAPABLE OF PREVENTING THE DECREASE OF THE WIDTH OF AN ACTIVE REGION

CROSS-REFERENCE TO RELATED APPLICATIONS

The present application claims priority to Korean patent application number 10-2007-0135599 filed on Dec. 21, 2007, which is incorporated herein by reference in its entirety.

BACKGROUND OF THE INVENTION

The present invention relates to a method of manufacturing a semiconductor device, and more particularly, to a method of manufacturing a semiconductor device, which can prevent the decrease of the width of an active region.

With the development of semiconductor manufacturing technologies, semiconductor devices are becoming more highly integrated and accordingly, the size of cell transistors are gradually decreasing. As the size of cell transistors decrease, the size of an isolation structure for electrically isolating devices also decreases.

As a result, techniques for effectively forming a small sized isolation structure have been examined in order to raise the integration level of a semiconductor device. That is to say, as the area of the semiconductor device occupied by the isolation structure decreases, techniques for forming an isolation structure capable of maximizing an insulation effect between elements have become increasingly important.

Hereinafter, a method for forming the isolation structure of a semiconductor device according to the conventional art will be schematically described with reference to FIGS. 1A and 1B.

Referring to FIG. 1A, a hard mask composed of a pad oxide layer 111 and a pad nitride layer 112 is formed on a semiconductor substrate 100 such that the isolation regions of the semiconductor substrate 100 are exposed.

By etching the exposed portions of the semiconductor substrate 100 using the hard mask as an etch mask, trenches 113 are defined in the isolation regions of the semiconductor substrate 100. A sidewall oxide 114, a linear nitride layer 115, and a linear oxide layer 116 are sequentially formed on the surfaces of the trenches 113.

Referring to FIG. 1B, an insulation layer 115 for isolation is filled in the trenches 113 which are formed with the linear oxide layer 116. The isolation structure 123 of the semiconductor device is formed by CMPing (chemically and mechanically polishing) the insulation layer for isolation. The isolation structure 123 is formed higher than the active regions 110 of the semiconductor substrate 100.

However, the isolation structure 123 formed according to the conventional art is likely to be gradually lost in a subsequent cleaning process. As a result, the isolation structure 123 has a height, which is lower than that of the active regions 110 of the semiconductor substrate 100.

FIG. 2 is a view illustrating a state in which an isolation structure is lost by implementing a cleaning process.

Referring to FIG. 2, as the isolation structure 123 has a height that is lower than that of the active regions 110 of the semiconductor substrate, a phenomenon, i.e., a moat phenomenon, occurs in which portions of the isolation structure 123 are depressed around the active regions 110. The moat phenomenon causes the oxidation of the sidewalls of the active regions 110 during an oxidation process for forming a gate oxide layer and thereby decreases the width of the active regions 110.

FIG. 3 is a view illustrating a state in which the width of the active region of a semiconductor substrate has decreased.

Referring to FIG. 3, the phenomenon, in which the width of the active regions 110 decreases by a gate oxidation process, serves as a factor that increases the resistance of the semiconductor device.

Meanwhile, after the isolation structure 123 is formed, an SEG (silicon epitaxial growth) process for forming an epi-silicon layer on the active regions 110 is implemented.

FIGS. 4 and 5 are views illustrating states in which epi-silicon layers are formed by an SEG process according to the conventional art.

Referring to FIG. 4, where the SEG process is implemented with the active regions 110 having a narrow width, the epi-silicon layer 160 can be formed into an abnormal shape.

Referring to FIG. 5, where the SEG process is implemented with the active regions 110 having a narrow width, a bridge phenomenon can occur between the epi-silicon layers 160.

SUMMARY OF THE INVENTION

Embodiments of the present invention are directed to a method for manufacturing a semiconductor device, which can prevent the loss of an isolation structure.

Embodiments of the present invention are also directed to a method for manufacturing a semiconductor device, which can prevent the decrease of the width of an active region.

Embodiments of the present invention are moreover directed to a method for manufacturing a semiconductor device, which can stably form epi-silicon layers.

In one aspect, a method for manufacturing a semiconductor device comprises the steps of forming trenches in a semiconductor substrate having active regions and isolation regions; forming a first insulation layer at the lower surface of the trenches; forming an etch protection layer on surfaces of the trenches which are filled with the first insulation layer; filling a second insulation layer in the trenches which are formed with the etch protection layer, and thereby forming an isolation structure in the isolation regions of the semiconductor substrate; and recessing portions of the active regions of the semiconductor substrate such that the isolation structure has a height higher than the active regions of the semiconductor substrate.

The trenches are defined using a hard mask, which is composed of a stack of a pad oxide layer and a pad nitride layer.

The pad nitride layer is formed to a thickness of 300~800 Å.

After the step of defining the trenches and before the step of forming the first insulation layer, the method further comprises the step of forming sequentially a sidewall oxide, a linear nitride layer and a linear oxide layer on entire surfaces of the trenches.

After the step of forming the linear oxide layer, the method further comprises the step of implementing a cleaning process for the semiconductor substrate formed with the linear oxide layer, using at least one solution among SPM, SC-1, BOE and HF.

The first insulation layer is formed as a flowable insulation layer.

The flowable insulation layer is formed through an SOD (spin-on dielectric) process using polysilazane or siloxane sol gel to a thickness of 3,000~7,000 Å.

The step of forming the first insulation layer at the lower surface of the trenches comprises the steps of filling a first insulation layer in the trenches; and recessing the first insulation layer.

The step of recessing the first insulation layer is implemented such that the first insulation layer has a height lower than the trenches by 50~200 Å.

After the step of forming the first insulation layer at the lower surface of the trenches and before the step of recessing the first insulation layer, the method further comprises the steps of heat-treating the first insulation layer; absorbing moisture into the heat-treated first insulation layer; and oxidating the first insulation layer which has absorbed moisture.

The step of heat-treating the first insulation layer is implemented in a furnace using at least one gas among $H_2$, $O_2$, $H_2O$, $H_2O_2$ and $O_3$ at a temperature of 200~650° C. for 20~200 minutes.

The step of absorbing moisture into the first insulation layer is implemented by immersing the first insulation layer in DI (deionized) water having a temperature of 50~95° C. for 5~60 minutes.

The step of oxidating the first insulation layer is implemented by exposing the first insulation layer in an SPM solution having a temperature of 100~250° C. for 5~30 minutes.

The etch protection layer can be a nitride layer.

The etch protection layer is formed to a thickness of 50~200 Å.

After the step of forming the etch protection layer and before the step of filling the second insulation layer, the method further comprises the step of forming a thin layer on a surface of the etch protection layer.

The thin layer can be an oxide layer.

The thin layer is formed to a thickness of 30~200 Å.

The second insulation layer is formed as any one among an HDP layer, a flowable insulation layer and an $O_3$-TEOS layer.

The step of recessing the portions of the active regions is implemented such that the active regions have a height lowered by 50~300 Å at portions of the trenches on which the etch protection layer is formed.

After the step of recessing the portions of the active regions, the method further comprises the steps of forming gates on the semiconductor substrate; and implementing an SEG process for the recessed semiconductor substrate and thereby forming an epi-silicon layer on the active regions on both sides of the gates.

DESCRIPTION OF SPECIFIC EMBODIMENT

In the present invention, an etch protection layer (i.e., a nitride layer) is formed between a first and second insulation for filling trenches. Therefore, the first insulation layer for filling trenches cannot be lost in a subsequent cleaning process due to the presence of the etch protection layer.

Accordingly, in the present invention, the isolation structure that is composed of the stacked first and second insulation layers for filling trenches is formed higher than the active regions of a semiconductor substrate.

As a result, in the semiconductor device manufactured according to the present invention, the occurrence of a bridge phenomenon between portions of the epi-silicon layer can be prevented since an epi-silicon layer can be stably formed in an SEG process for increasing the width of the active regions of the semiconductor substrate.

Hereinafter, a specific embodiment of the present invention will be described in detail with reference to the attached drawings.

FIGS. 6A through 6G are sectional views illustrating the processes for a method of manufacturing a semiconductor device in accordance with an embodiment of the present invention.

Figure 1A:
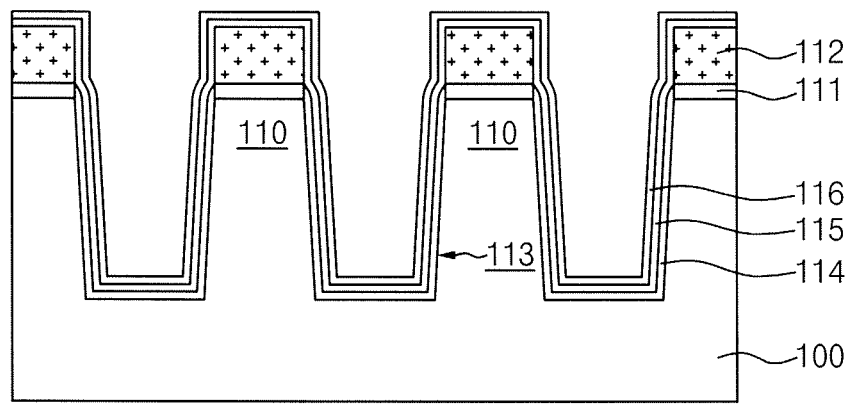
FIGS. 1A and 1B are sectional views illustrating the processes for a method of forming an isolation structure of a semiconductor device according to the conventional art.
Figure 1B:
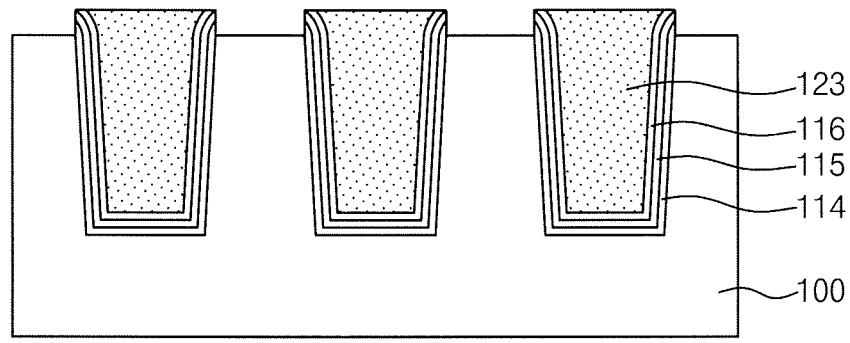
Figure 2:
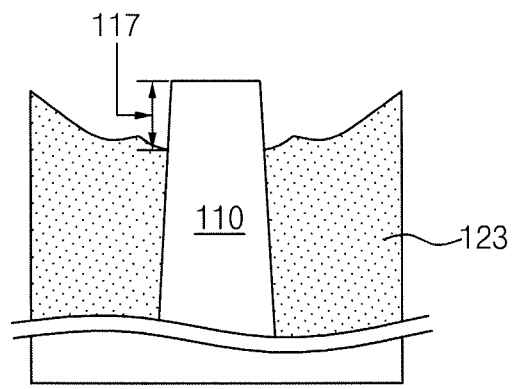
FIG. 2 is a sectional view illustrating a state in which an isolation structure is lost according to the conventional art.
Figure 3:
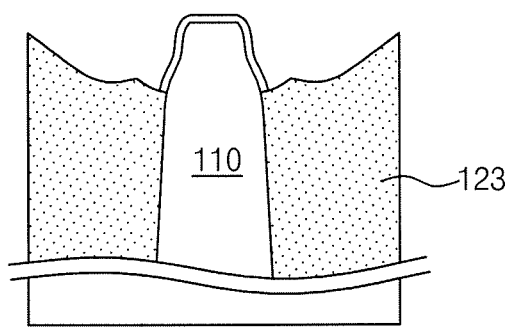
FIG. 3 is a sectional view illustrating a state in which the width of the active region of a semiconductor substrate decreases according to the conventional art.
Figure 4:
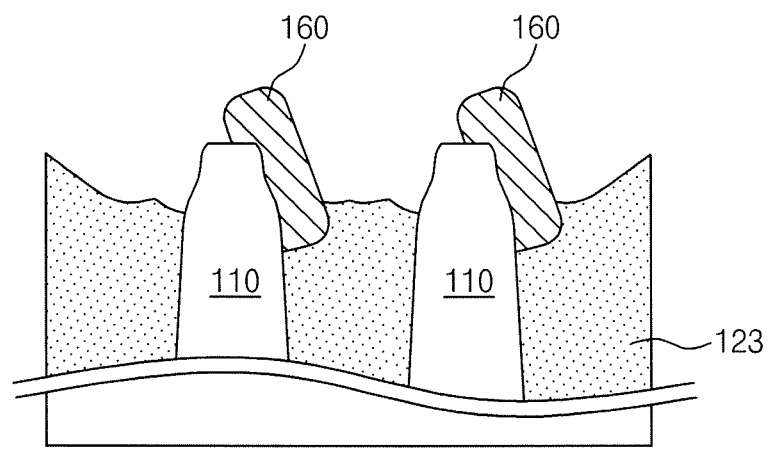
FIG. 4 is a sectional view illustrating a state in which an epi-silicon layer is abnormally grown according to the conventional art.
Figure 5:
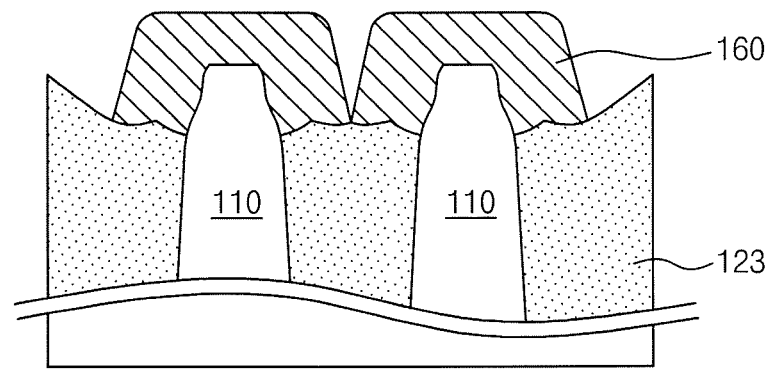
FIG. 5 is a sectional view illustrating a state in which a bridge phenomenon occurs between portions of an epi-silicon layer according to the conventional art.
Figure 6A:
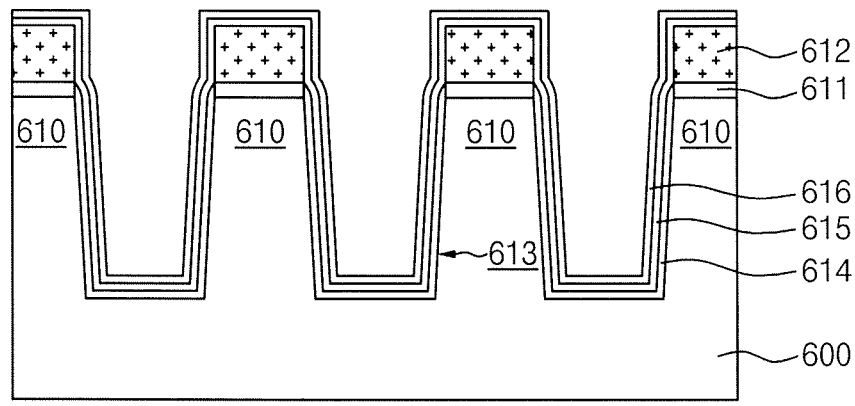
FIGS. 6A through 6G are sectional views illustrating the processes for a method of manufacturing a semiconductor device in accordance with an embodiment of the present invention.

Referring to FIG. 6A, a hard mask, composed of a pad oxide layer 611 and a pad nitride layer 612, is formed on the semiconductor substrate 600 having active regions 610 and isolation regions. The hard mask is formed such that the isolation regions are exposed. The pad nitride layer 612 is formed to a thickness of 300~800 Å. Trenches 613 are defined in the isolation regions of the semiconductor substrate 600 by etching the exposed portions of the semiconductor substrate 600 using the hard mask as an etch mask.

A sidewall oxide 614, a linear nitride layer 615 and a linear oxide layer 616 are formed on the surfaces of the trenches 613. The linear nitride layer 615 is formed to buffer stress and to prevent oxidation. The linear oxide layer 616 is formed to improve the adhesion property of an isolation structure to be subsequently formed. A cleaning process is then performed on the semiconductor substrate 600 which is formed with the linear oxide layer 616. The cleaning process is performed using at least one solution among SPM, SC-1, BOE and HF. The cleaning process removes the organic substance formed on the surface of the liner oxide layer 616.

Figure 6B:
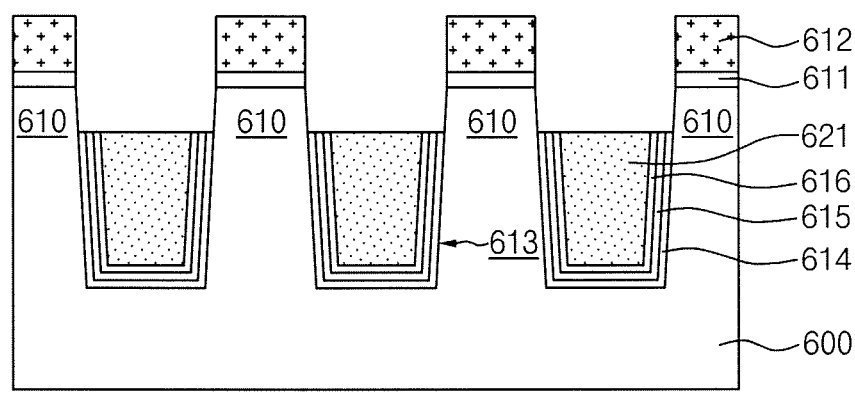

Referring to FIG. 6B, a first insulation layer 621 is filled in the trenches 613. The first insulation layer 621 is formed as a flowable insulation layer. The flowable insulation layer is formed through an SOD process. The flowable insulation layer is formed of polysilazane or siloxane sol gel. The flowable insulation layer is formed to a thickness of 3,000~7,000 Å. The first insulation layer 621 is baked at a temperature of 50~400° C. for 30~600 seconds. The impurities contained in the first insulation layer 621 are removed by the baking.

The first insulation layer 621 is primarily heat-treated. The first insulation layer 621 is densified through the primary heat treatment. The primary heat treatment is implemented in a furnace using at least one gas among $H_2$, $O_2$, $H_2O$, $H_2O_2$ and $O_3$ at a temperature of 200~650° C. for 20~200 minutes. The first insulation layer 621 having undergone the primary heat treatment is immersed in DI (deionized) water having a temperature of 50~95° C. for 5~60 minutes. As a result of the immersion, moisture is absorbed into the first insulation layer 621 having undergone the primary heat treatment. The first insulation layer 621 having absorbed the moisture is exposed in an SPM compound having a temperature of 100~250° C. for 5~30 minutes. As a result of the exposure, the first insulation layer 621 having absorbed the moisture is oxidated. The characteristics of the first insulation layer 621 are improved through the oxidation process.

The oxidized first insulation layer 621 is CMPed (chemically and mechanically polished) to expose the pad nitride layer 612. The CMPed first insulation layer 621 is recessed leaving a portion partially filling the trenches 613. The first insulation layer 621 is recessed 50~200 Å below the trenches.

The recessed first insulation layer 621 is heat-treated a second time. The secondary heat treatment is implemented by annealing at a temperature of 650~980° C.

Figure 6C:
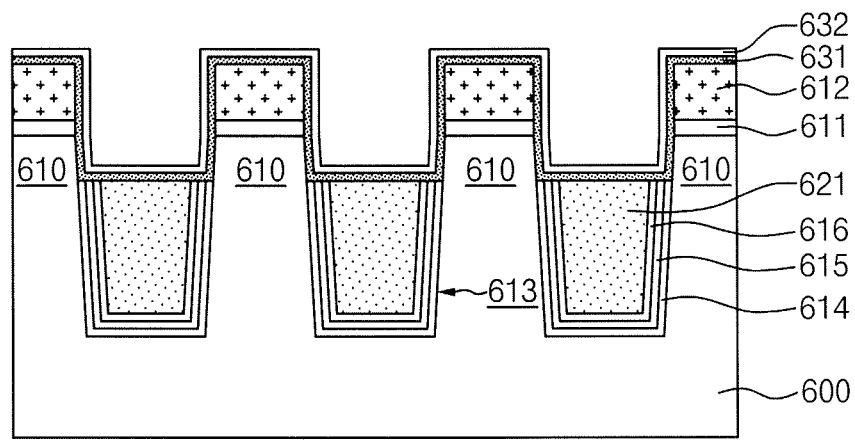

Referring to FIG. 6C, an etch protection layer 631 is formed on the surfaces of the first insulation layer 621 and the trenches 613. The etch protection layer 631 is formed as a nitride layer to a thickness of 50~200 Å. A thin layer 632 is formed on the etch protection layer 631 to a thickness of 30~200 Å. The thin layer 632 is formed as an oxide layer having an excellent step coverage characteristic. The thin layer 632 is formed to protect the etch protection layer 631 in subsequent processes.

Figure 6D:
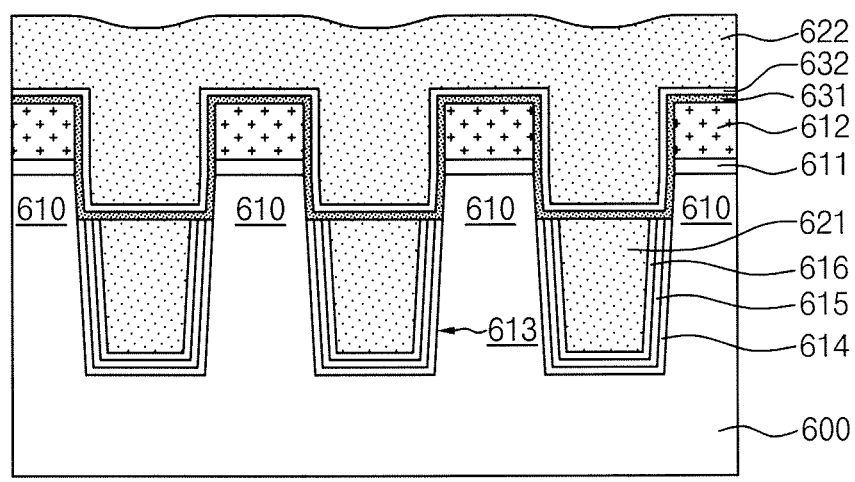

Referring to FIG. 6D, a second insulation layer 622 is formed in the trenches 613 in which the first insulation layer 621 is formed. The second insulation layer 622 is filled in the trenches 613 through any one of SOD, HDP (high density plasma) and $O_3$-TEOS.

The second insulation layer 622 is tertiarily heat-treated. The second insulation layer 622 is densified through the tertiary heat treatment. The tertiary heat treatment is implemented in a furnace at a temperature of 300~900° C.

Figure 6E:
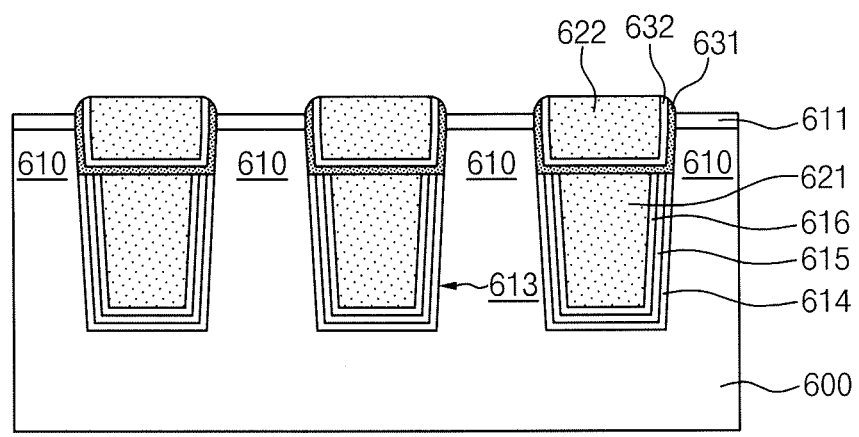

Referring to FIG. 6E, the second insulation layer 622 is CMPed to expose the pad nitride layer 612. The exposed pad nitride layer 612 is then removed. As a result, an isolation structure 623 (as seen in FIG. 6F) is formed in the trenches 613 comprising the stacked first insulation layer 621 and the second insulation layer 622.

Meanwhile, after the pad nitride layer 612 is removed, the second insulation layer 622 is heat-treated at a temperature of 600~980° C.

Figure 6F:
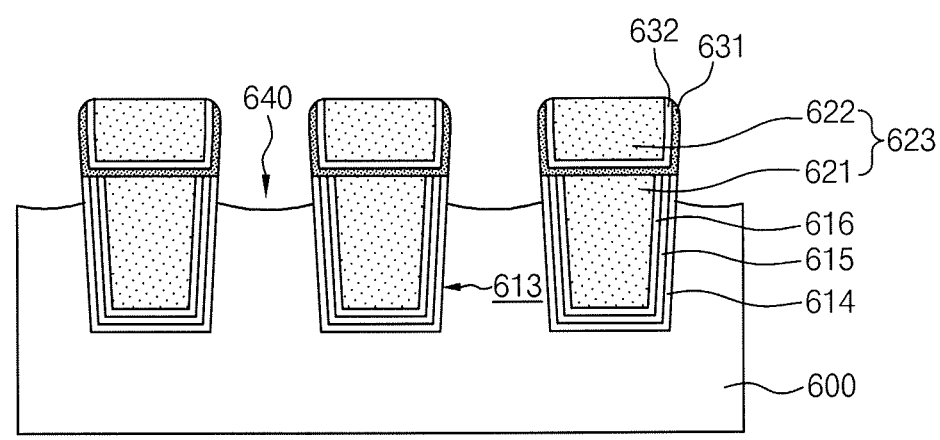

Referring to FIG. 6F, the pad oxide layer 611, which is exposed due to the removal of the pad nitride layer 612, is removed. The active regions 610 of the semiconductor substrate 600 which are exposed due to the removal of the pad oxide layer 611 are recessed as indicated by reference numeral 640. As a result, the isolation structure 623 has a height higher than the active regions 610 of the semiconductor substrate 600 due to the recessing of the active regions 610. Preferably, the active regions 610 are recessed 50~300 Å below the etch protection layer 631.

Meanwhile, the recessing of the active regions 610 can be selectively implemented in the respective active regions of cell areas and peripheral areas, or only in cell areas using a mask pattern.

Figure 6G:
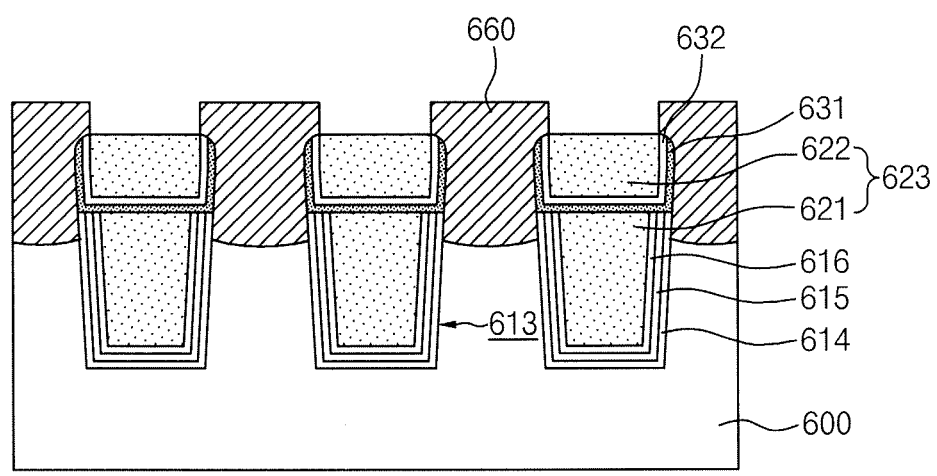

Referring to FIG. 6G, grooves 600H (see FIG. 7) are defined in the gate forming areas of the semiconductor substrate 600 by performing an etching process of the gate forming areas of the semiconductor substrate 600. A gate oxide layer is formed on the semiconductor substrate 600 including the grooves 600H through a gate oxidation process. A stack including a gate conductive layer and a gate hard mask layer is formed on the gate oxide layer. As a result, gates 650 (see FIG. 7) composed of the gate oxide layer, the gate conductive layer, and the gate hard mask layer are formed in and on the grooves 600H. Sources and drains 671 and 672 (see FIG. 7) are formed in the semiconductor substrate 600 on both sides of the gates 650. That is to say, the sources and drains 671 and 672 are formed in the recessed active regions 610.

An epi-silicon layer 660 is formed on the active regions 610 in the zones of the sources and drains 671 and 672. The epi-silicon layer 660 is formed through an SEG process. The epi-silicon layer 660 can be stably formed on the active regions 610 since the epi-silicon layer 660 is formed to have the width of the active regions 610 and is not decreased.

Figure 7:
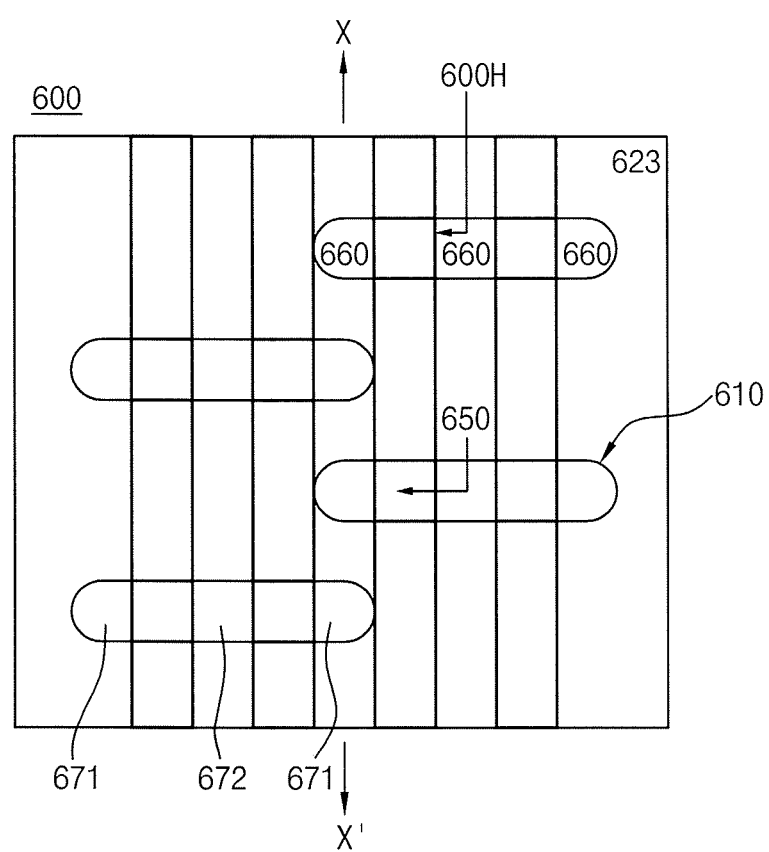
FIG. 7 is a plan view illustrating the method of manufacturing a semiconductor device in accordance with the embodiment of the present invention.

FIG. 7 is a plan view of FIG. 6G. FIG. 6G is a sectional view taken along the line X-X' of FIG. 7.

Hereinafter, while not shown in the drawings, the semiconductor device according to the embodiment of the present invention is manufactured through a series of well-known processes subsequently performed.

As is apparent from the above description, in the semiconductor device according to an embodiment of the present invention, an isolation structure composed of first and second insulation layers for filling trenches is formed. An etch protection layer is also formed between the first and second insulation layers.

Accordingly, in the semiconductor device according to an embodiment of the present invention, a phenomenon in which the isolation structure is lost in a subsequent cleaning process is prevented from occurring due to the presence of the etch protection layer. As a result, a moat is not formed in the isolation structure and the width of the active regions of a semiconductor substrate does not decrease.

Therefore, in the semiconductor device according to the present invention, an epi-silicon layer can be stably formed by an SEG process and thereby, the contact resistance of elements can be decreased. Also, the epi-silicon layer can be highly formed than the liner nitride layer by present invention and thereby, a HEIP property of PMOS can be removed. Moreover, the epi-silicon layer can be highly formed by present invention and thereby, a short channel effect can be improved. Addition, the portion of the isolation layer at the both sides of the gate functions to support the gate and thereby, the leaning of the gate is prevented.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    defining trenches in isolation regions of a semiconductor substrate having active regions and isolation regions;
    forming a first insulation layer in a lower portion of the trenches;
    forming an etch protection layer on surfaces of the trenches that are filled with the first insulation layer and forming an oxide layer on the etch protection layer for preventing the first insulation layer from being etched in a succeeding process;
    filling a second insulation layer in the trenches that are formed with the etch protection layer, the oxide layer, and the first insulation layer to form an isolation structure in the isolation regions of the semiconductor substrate; and
    recessing an entire surface of the active regions of the semiconductor substrate such that the isolation structure has a height higher than the active regions of the semiconductor substrate, wherein recessing the portions of the active regions is performed such that the active regions are recessed below a lowermost bottom portion of the etch protection layer, wherein the etch protection layer is formed as a nitride layer.

2. The method according to claim 1, wherein the trenches are defined using a hard mask that is composed of a stacked structure including a pad oxide layer and a pad nitride layer.

3. The method according to claim 2, wherein the pad nitride layer is formed to a thickness in the range of 300~800 Å.

4. The method according to claim 1, wherein, after the step of defining the trenches and before the step of forming the first insulation layer, the method further comprising the step of:
sequentially forming a sidewall oxide, a linear nitride layer, and a linear oxide layer on an entire surface of the trenches.

5. The method according to claim 4, wherein, after the step of forming the linear oxide layer, the method further comprising the step of:
performing a cleaning process of the semiconductor substrate formed with the linear oxide layer, using at least one solution from the group consisting of SPM, SC-1, BOE and HF.

6. The method according to claim 1, wherein the first insulation layer is formed as a flowable insulation layer.

7. The method according to claim 6, wherein the flowable insulation layer is formed through an SOD process using polysilazane or siloxane sol gel to a thickness in the range of 3000~7,000 Å.

8. The method according to claim 1, wherein the step of forming the first insulation layer in a lower portion of the trenches comprises the steps of:
filling the first insulation layer in the trenches; and
recessing the first insulation layer.

9. The method according to claim 8, wherein the step of recessing the first insulation layer is performed such that the first insulation layer is recessed to a range of 50~200 Å below the trenches.

10. The method according to claim 8, wherein after the step of filling a first insulation layer in the trenches and before the step of recessing the first insulation layer, the method further comprising the steps of:
heat-treating the first insulation layer;
absorbing moisture into the heat-treated first insulation layer; and
oxidating the first insulation layer that has absorbed moisture.

11. The method according to claim 10, wherein the step of heat-treating the first insulation layer is preformed in a furnace using at least one gas from the group consisting of $H_2$, $O_2$, $H_2O$, $H_2O_2$ and $O_3$ at a temperature in the range of 200~650° C. for 20~200 minutes.

12. The method according to claim 10, wherein the step of absorbing moisture into the first insulation layer is performed by immersing the first insulation layer in DI water having a temperature in the range of 50~95° C. for 5~60 minutes.

13. The method according to claim 10, wherein the step of oxidating the first insulation layer is performed by exposing the first insulation layer in an SPM solution having a temperature in the range of 100~250° C. for 5~30 minutes.

14. The method according to claim 1, wherein the etch protection layer is formed to a thickness in the range of 50~200 Å.

15. The method according to claim 1, wherein, after the step of forming the etch protection layer and before the step of filling the second insulation layer, the method further comprising the step of:
forming a thin layer on a surface of the etch protection layer.

16. The method according to claim 15, wherein the thin layer is formed as an oxide layer.

17. The method according to claim 15, wherein the thin layer is formed to a thickness in the range of 30~200 Å.

18. The method according to claim 1, wherein the second insulation layer is formed as any one from the group consisting of an HDP layer, a flowable insulation layer and an $O_3$-TEOS layer.

19. The method according to claim 1, wherein the step of recessing the portions of the active regions is performed such that the active regions are recessed to a range of 50~300 Å below the portion of the etch protection layer formed between the first and second insulation layers.

20. The method according to claim 1, wherein, after the step of recessing the portions of the active regions, the method further comprising the steps of:
forming gates on the semiconductor substrate; and
performing an SEG process for the recessed semiconductor substrate to form an epi-silicon layer on the active regions on both sides of the gates.

\* \* \* \* \*